United States Patent [19]

Hardy et al.

[11] Patent Number: 5,313,163

[45] Date of Patent: May 17, 1994

[54] SAMPLING-RING SATURATION PULSE FOR TWO-DIMENSIONAL MAGNETIC RESONANCE SELECTIVE EXCITATION

[75] Inventors: Christopher J. Hardy; Edward J. Nieters, both of Schenectady, N.Y.

[73] Assignee: General Electric Company, Schenectady, N.Y.

[21] Appl. No.: 928,390

[22] Filed: Aug. 12, 1992

[51] Int. Cl.$^5$ .............................................. G01V 3/00
[52] U.S. Cl. ..................................... 324/309; 324/307
[58] Field of Search ............... 324/300, 307, 309, 312, 324/313, 314, 318

[56] References Cited

U.S. PATENT DOCUMENTS 5,105,152  4/1992  Pauly .................................. 324/309
5,122,747  6/1992  Riederer et al. .................... 324/309

OTHER PUBLICATIONS

Joel P. Felmlee, MS & Richard L. Ehman, MD, "Spatial Presaturation: A Method for Suppressing Flow Artifacts and Improving Depiction of Vascular Anatomy in MR Imaging", 1987, pp. 559–564.

John Pauly, Dwight Nishimura & Albert Macovski, Journal of Magnetic Resonance,"A k-Space Analysis of Small Tip-Angle Excitation", 1989, pp. 43–56.

Steven Conolly, Dwight Nishimura, Albert Macovski & Gary Glover, Journal of Magnetic Resonance, "Variable-Rate Selective Excitation", 1988, pp. 440–458.

William H. Press, Brian P. Flannery, Saul A. Teukolsky & William T. Vetterling,"Numerical Recipes: The Art of Scientific Computing", 1986, pp. 86–89.

Christopher J. Hardy, Harvey E. Cline & Paul A. Bottomley, Journal of Magnetic Resonance, "Correcting for Nonumiform k-Space Sampling in Two-Dimensional NMR Selective Excitation," 1990, pp. 639–645.

J. Appl. Phys. 66(4), Christopher J. Hardy & Harvey E. Cline, "Broadband Nuclear Magnetic Resonance Pulses With Two-Dimensional Spatial Selectivity", 1989, pp. 1513–1516.

Reprint, Journal of Computer Assisted Tomography, Christopher J. Hardy, Justin D. Pearlman, James R. Moore, Peter B. Roemer & Harvey E. Cline, "Rapid NMR Cardiography With A Half-Echo M-Mode Method", 1991, pp. 868–874.

Primary Examiner—Louis Arana
Attorney, Agent, or Firm—Lawrence P. Zale; Marvin Snyder

[57] ABSTRACT

A method for suppressing sampling-ring artifacts produced by spiral-scan-based 2D selective excitation pulses, such as a those exciting a 'pencil-shaped' region, employs a 2D annular saturation pulse followed by a gradient 'crusher' lobe which dephases the transverse magnetization in the annular region. The annular saturation pulse is itself based on a spiral k-space trajectory having a limited number of cycles and a small outer radius, and is designed to saturate magnetization of tissue of the subject corresponding to the artifact rings of an excitation region while not affecting a central region. The annular saturation pulse may also be reshaped to limit the peak RF power to levels currently used for clinical MR imaging, while preserving bandwidth and the 2D excitation profile.

8 Claims, 11 Drawing Sheets

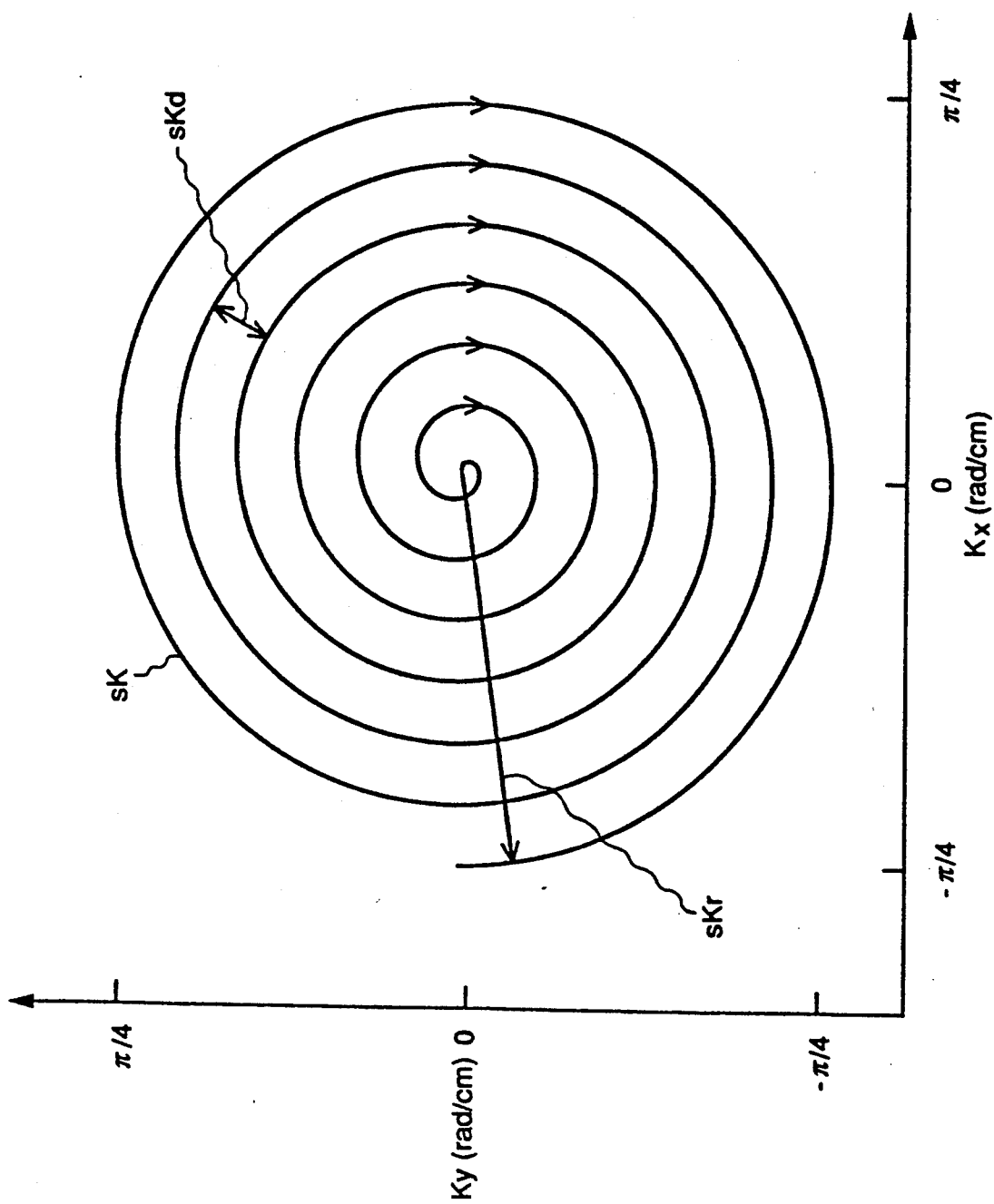

SAMPLING-RING SATURATION PULSE FOR TWO-DIMENSIONAL MAGNETIC RESONANCE SELECTIVE EXCITATION

BACKGROUND OF THE INVENTION

1. Field of the Invention

The present application relates to nuclear magnetic resonance (NMR) imaging, and more particularly to a method for suppressing artifacts in NMR images created by two-dimensional (2D) NMR selective excitation pulses.

2. Description of Related Art

Nuclear magnetic resonance (NMR) imaging utilizing two-dimensional (2D) selective excitation pulses applied to a subject to be imaged has demonstrated its utility in a number of applications, including spectral localization, real-time NMR cardiac profiling and selective tagging of blood. An acquired NMR signal suffers, however, from artifacts which arise from the discrete manner in which these pulses cover k space, where k space is defined as the spatial frequency domain, obtained by taking the two-dimensional (2D) Fourier transformation of a region in a spatial domain. In particular, pulses derived from spiral k-space trajectories yield concentric ring artifacts surrounding a central excitation region. The spacing between artifacts is inversely proportional to the spacing between adjacent cycles of the spiral. These artifacts may consequently be pushed out to larger radii, and thus out of the imaging region, by increasing the density of sampling of k space. This, however, requires more highly oscillating and therefore longer gradient waveforms, resulting in compromised speed of imaging and bandwidth.

A slice selective presaturation pulse sequence was described in *Spatial Presaturation: A Method for Suppressing Flow Artifacts and Improving Depiction of Vascular Anatomy in MR imaging*, by J. P. Felmlee, et al., Radiology 164, 559 (1987). This method was employed for saturating NMR signals from flowing blood outside a region of interest thereby reducing blood flow artifacts in an NMR image. This method has been adapted to eliminate the innermost sampling-ring artifact from 2D 'pencil excitation' waveforms in NMR cardiac imaging, as described in *Rapid NMR Cardiography with a Half-echo M-mode Method*, by C. J. Hardy, et al., J. Comput. Assist. Tomogr. 15, 868 (1991). However, this presaturation pulse sequence requires selective excitation and dephasing of magnetization from two separated slabs of tissue in one direction, followed by the same procedure for two slabs of tissue in an direction orthogonal to the first two slabs, and consequently is too long (approximately 17 ms) to be used with some imaging techniques.

It is therefore desirable to provide a method for suppressing excitation artifacts from 2D selective excitation pulses, which is compatible with imaging techniques requiring short imaging pulses, and does not exceed limits for RF power deposition in living subjects.

OBJECTS OF THE INVENTION

An object of the invention is to efficiently suppress excitation artifacts created by 2D selective excitation pulses derived from spiral k-space trajectories.

BRIEF SUMMARY OF THE INVENTION

In accordance with the invention, sampling-ring artifacts produced by spiral-scan-based 2D selective excitation pulses such as pulses which excite a "pencil-shaped" region are suppressed by saturating the magnetization in an annular ring of tissue of a subject, thereby not affecting tissue in a central unsaturated region of the annulus. This is achieved by applying a 2D annular excitation pulse followed by a gradient 'crusher' lobe. The 'crusher' lobe dephases the transverse magnetization in the annular ring. A spiral-scan-based excitation pulse is then applied to localize to a region inside the central unsaturated region, for imaging. The actual applied annular excitation pulse is reshaped to limit the peak RF power to levels currently used for clinical magnetic resonance (MR) imaging, while preserving bandwidth and the excitation profile.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 3b is the 2D NMR excitation profile of the pulse of FIG. 3a.

FIG. 4a shows the spiral k-space trajectory used to design an annular NMR excitation pulse.

FIG. 4b is a pulse-sequence timing diagram for the annular NMR excitation pulse corresponding to the k-space trajectory of FIG. 4a.

DETAILED DESCRIPTION OF THE INVENTION

Figure 1:
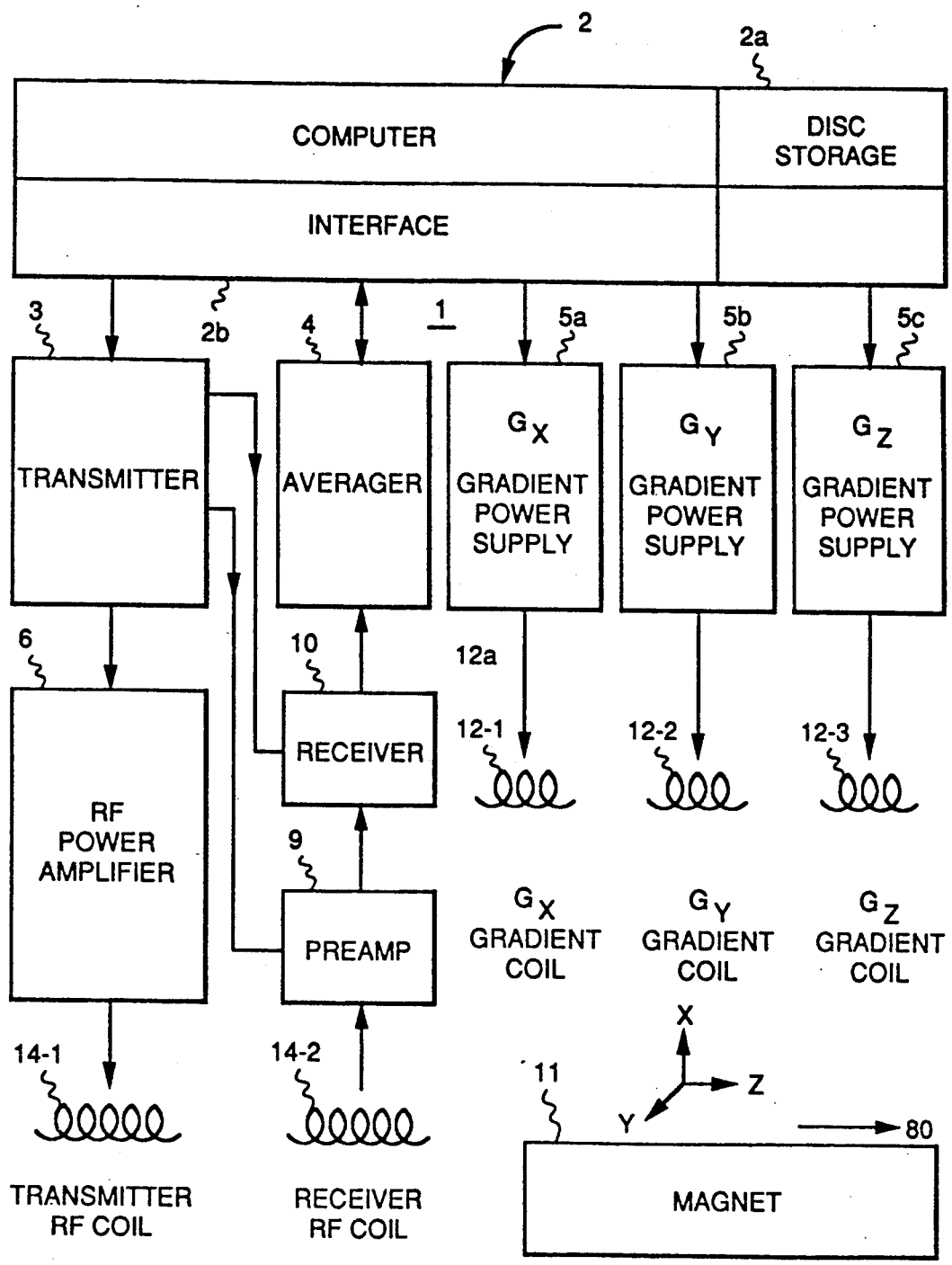
FIG. 1 is a block diagram of a magnetic resonance (MR) imaging system suitable for use with the method of the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, respectively, in the "X", "Y", "Z" directions, respectively, over a subject to be imaged. RF transmitter 3 is gated with pulse envelopes from computer 2 to generate RF pulses having the required modulation to excite an MR response signal from a subject. The RF pules are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

Magnetic field gradient coils 12-1, 12-2, and 12-3 are necessary to provide gradients $G_x$, $G_y$, and $G_z$, respectively, that are monotonic and linear over the sample volume. Multivalued gradient fields cause a degradation in the MR response signal data, known as aliasing, which leads to severe image artifacts. Nonlinear gradients cause geometric distortions of the image.

Figure 2:
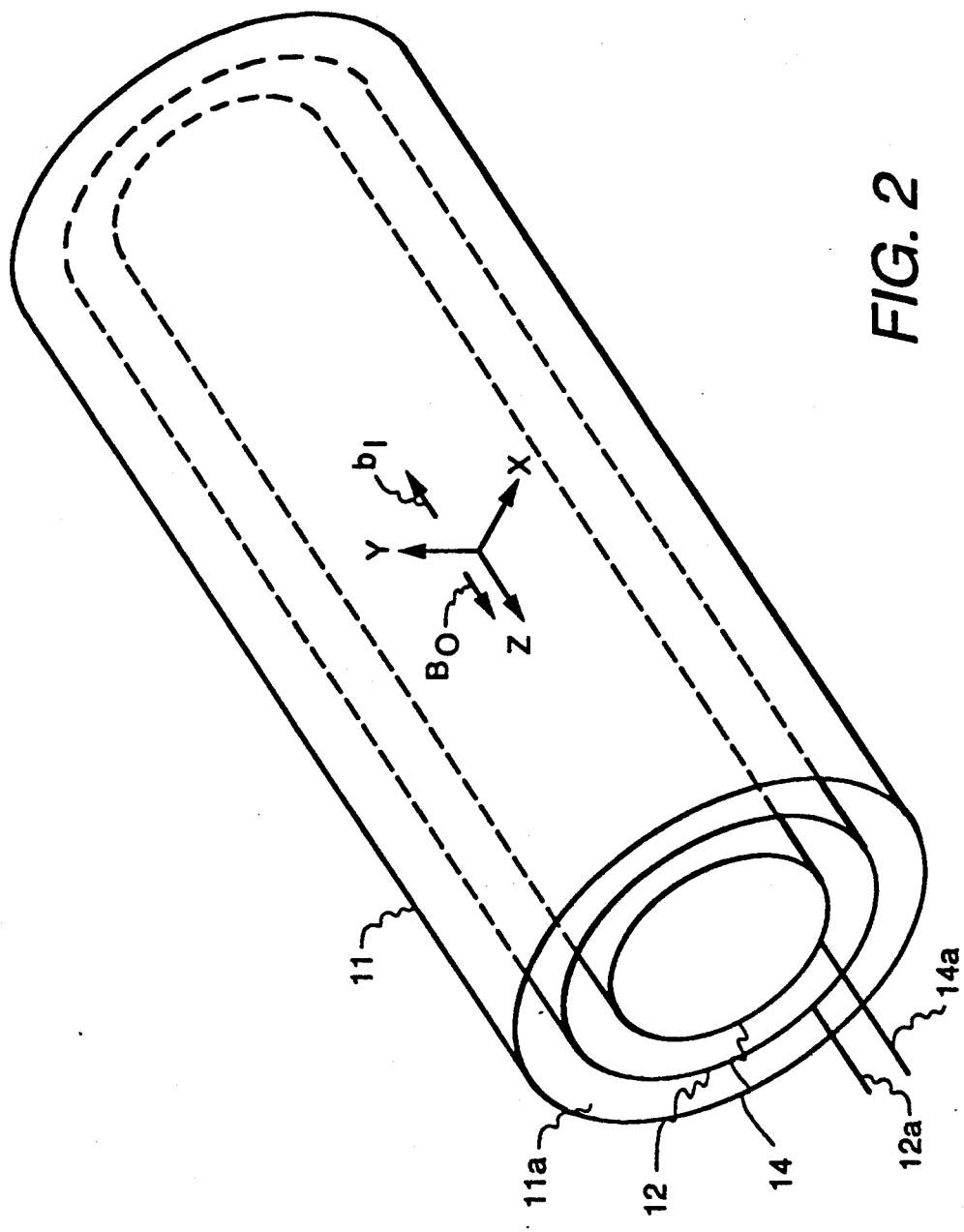
FIG. 2 is a perspective, partial schematic view of the MR imaging magnet, gradient coils, and radiofrequency (RF) coils of FIG. 1.

Main magnet 11, shown schematically detail in FIG. 2, has a central cylindrical bore 11a which generates a static magnetic field $B_0$, typically in the axial, or Z Cartesian coordinate direction. A set of coils 12, such as coils 12-1, 12-2, 12-3 of FIG. 1, receive electrical signals via input connections 12a, and provide at least one gradient magnetic field within the volume of bore 11a. Also situated within bore 11a is an RF coil 14, which receives RF energy via at least one input cable 14a, to provide an RF magnetic field $b_1$, typically in the X-Y plane.

Figure 3A:
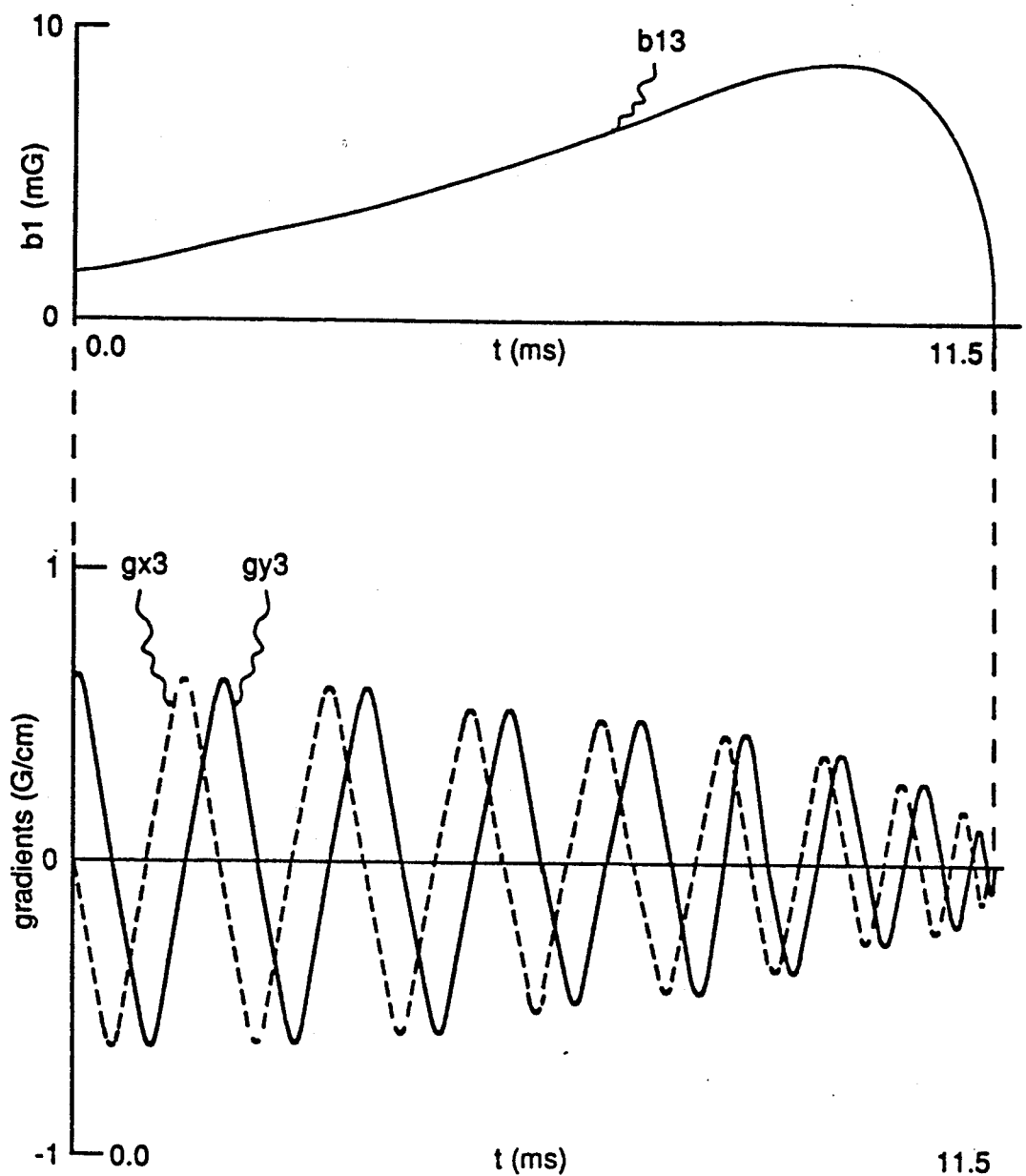
FIG. 3a is a pulse-sequence timing diagram for a conventional NMR pencil excitation pulse.
Figure 3B:
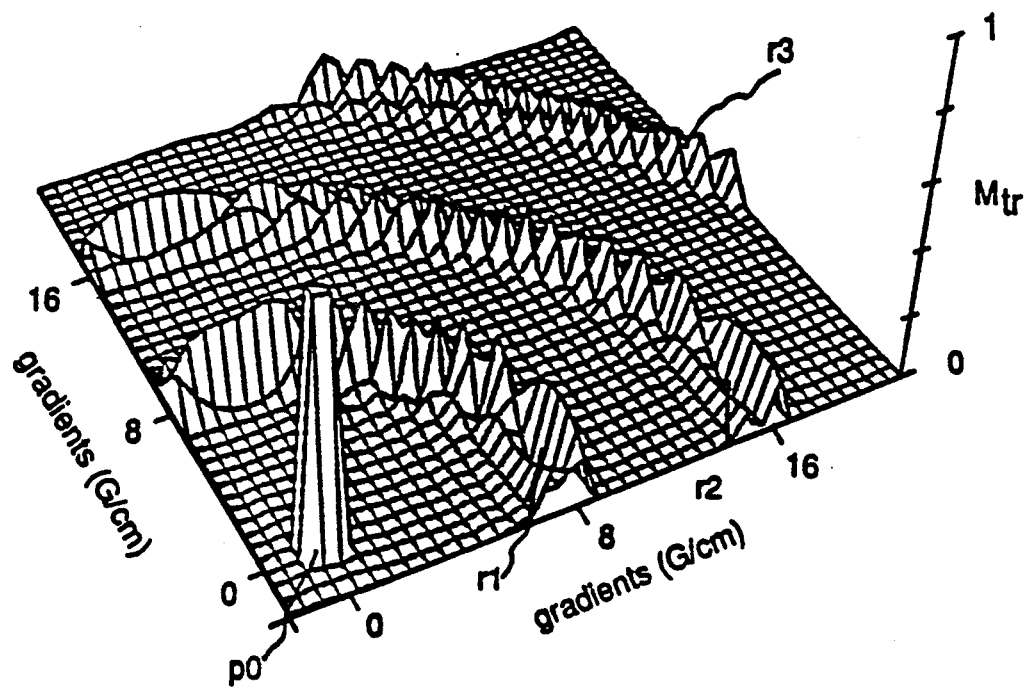

FIG. 3a shows an RF waveform b13 and the concurrent x and y gradient waveforms gx3 and gy3 used to excite a 1-cm-diameter cylindrical 'pencil-shaped' region, (hereinafter a "pencil excitation pulse"). This pulse is derived from an 8-cycle-spiral k-space trajectory, and thus is characterized by 8 oscillations in gradient waveforms gx3 and gy3. The resulting 2D excitation profile is shown in FIG. 3b, with a cross section through the profile displayed in FIG. 3c. It can be seen that, in addition to the central excited pencil-shaped region p0, there are a series of concentric sampling rings r1, r2, r3, etc. These are located at radii which are multiples of $2\pi n/\kappa = 8$ cm, where n is the number of cycles in the k-space spiral and $\kappa = 6.3$ is the outer radius of the spiral for this embodiment. The duration of the excitation pulse can be expressed as $T_s = (\frac{8}{9})T = 11.5$ ms for this pulse. Here $T = 2\pi n \sqrt{\kappa/(\gamma s)}$, $\gamma$ is the nuclear gyromagnetic ratio, s = 2000 Gauss/cm/sec. is the maximum gradient slew rate for a typical whole-body MR imager, and the factor of $\frac{8}{9}$ comes from an optimized traversal of the k-space spiral. To push the inner sampling ring r1 out to a radius of 24 cm without loss of edge definition would require the use of a 24 cycle spiral, resulting in a pulse length of roughly 35 ms.

Ring Saturation Pulses

To eliminate the innermost sampling rings r1 and r2, a 90° annular excitation pulse followed by a gradient 'crusher' dephasing lobe is applied to presaturate regions of the sample corresponding to these sampling rings. The annular excitation pulse, derived from the spiral k-space trajectory sk of FIG. 4a, will have a sampling-ring artifact of its own. However, this can be pushed out to very large radii by keeping the intercycle spacing skd of the spiral small, and will be dephased by the crusher gradient in any case. To keep the pulse duration short, we limit the number of cycles in the spiral sk to n = 6.5. This results in a small spiral radius skr = $\pi/4$ radians/cm, and thus poor spatial resolution, but high resolution is not necessary for the annular profile.

The two orthogonal magnetic-field-gradient pulses of the annular region are derived by taking the time derivative of the motion along the trajectory sk of FIG. 4a. To achieve constant gradient slew rate and thus optimal bandwidth, the spiral is traversed at a nonlinear rate, as outlined in *Broadband Nuclear Magnetic Resonance Pulses with Two-Dimensional Spatial Selectivity* by C. J. Hardy, et al., J. Appl. Phys. 66, 1513–6 (1989). Thus, the 2D position in k space as a function of time $(k_x(t), k_y(t))$ can be expressed as $k = k_x + ik_y = \tau (\omega/T) e^{i\omega\tau}$, where $\kappa$ is the outer radius skr of the spiral, $\omega = 2\pi n/T$, n is the number of cycles in the spiral, $0 < \tau < T$, and $\tau$ indicates position on the spiral. The time dependence of $\tau$ for a constant-slew-rate outward traversal of the spiral is $\tau(t) = T(t/T_s)^{\frac{3}{8}}$, where the pulse length $T_s = (\frac{8}{9})$ T, $T = 2\pi n \sqrt{\kappa/\gamma s}$, and t is time.

Figure 4B:
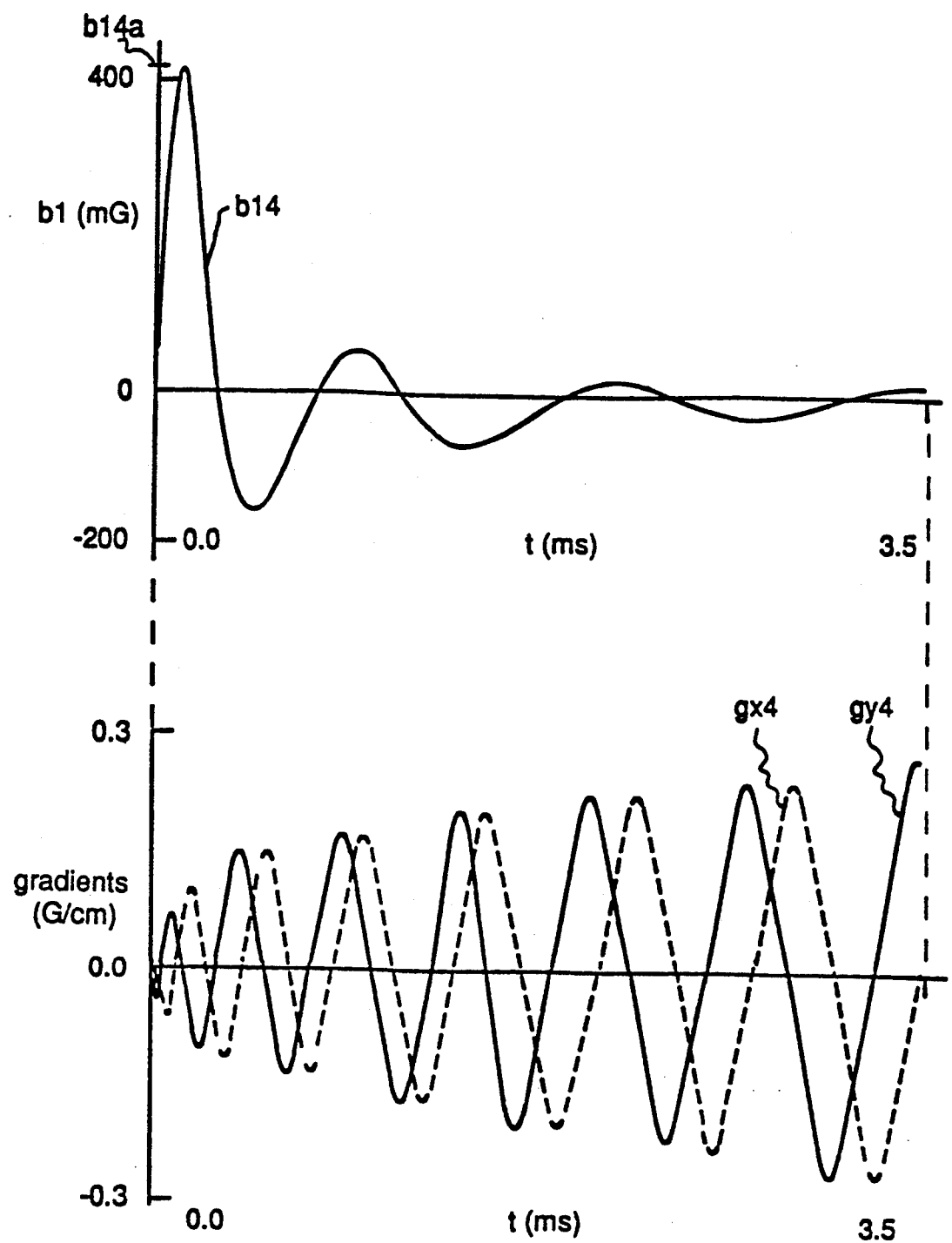

Taking the time derivative of this motion along trajectory sk results in magnetic-field-gradient pulses gx4 and gy4 shown in FIG. 4b. As presented in *A k-space Analysis of Small-Tip-Angle Excitation* by J. Pauly, et al., J. Magn. Reson. 81, 43–56 (1989), the magnetic field gradient pulses are expressed as:

$$g_x(t) = \frac{1}{\gamma} \left( \frac{dk_x(t)}{dt} \right) \quad (1)$$

$$g_y(t) = \frac{1}{\gamma} \left( \frac{dk_y(t)}{dt} \right) \quad (2)$$

where $g_x(t)$ and $g_y(t)$ are the x and y gradient waveforms, respectively, as a function of time.

The accompanying RF waveform is derived by taking the Fourier transformation of a desired target annulus, defined as a function $P_{targ}(x,y)$, sampled by the motion along the trajectory sk, in accordance with principles of 2D selective pulse design. The target annulus $P_{targ}(x,y)$ is defined to be 1 for $r_i \leq r_a \leq r_o$, 0 for $r_a < r_i$, and 0 for $r_a > r_o$, where $r_i = 5$ cm is an inner annular radius, $r_o = 25$ cm is an outer annular radius, and the radius $r_a = \sqrt{x^2 + y^2}$.

Principles described in *Correcting for Nonuniform k-space Sampling in Two-dimensional NMR Selective Excitation* by C. J. Hardy, et al., J Magn Reson 87, 639–45 (1990), hereby incorporated by reference, may be used to define the RF pulse by an in-phase component $b_{1I}(t)$, and a quadrature-phase component $b_{1Q}(t)$ according to the following equations:

$$b_{1I}(t) = W(t) \int_{-\infty}^{\infty} \int_{-\infty}^{\infty} P_{targ}(x,y) \sin(k_x(t)x + k_y(t)y) dx dy \quad (3a)$$

$$b_{1Q}(t) = -W(t) \int_{-\infty}^{\infty} \int_{-\infty}^{\infty} P_{targ}(x,y) \sin(k_x(t)x + k_y(t)y) dx dy \quad (3b)$$

where $$W(t) = \left( \frac{1}{\rho(k_x(t), k_y(t))} \right) \sqrt{g_x(t)^2 + g_y(t)^2} \quad (4)$$

The factor $$\frac{1}{\rho(k_x(t), k_y(t))}$$

in Eq. (4) corrects the RF amplitude waveform for the uneven spacing between adjacent lines of a trajectory. This function varies for different trajectories. For trajectory sk of FIG. 4a, this term is expressed as:

$$\frac{1}{\rho(k_x(t), k_y(t))} = \frac{k_m(t)/\kappa}{\sqrt{(k_m(t)/\kappa)^2 + 1/(2\pi n)^2}}, \quad (5)$$

where $$k_m(t) = \sqrt{k_x(t)^2 + k_y(t)^2}. \quad (6)$$

Figure 4C:
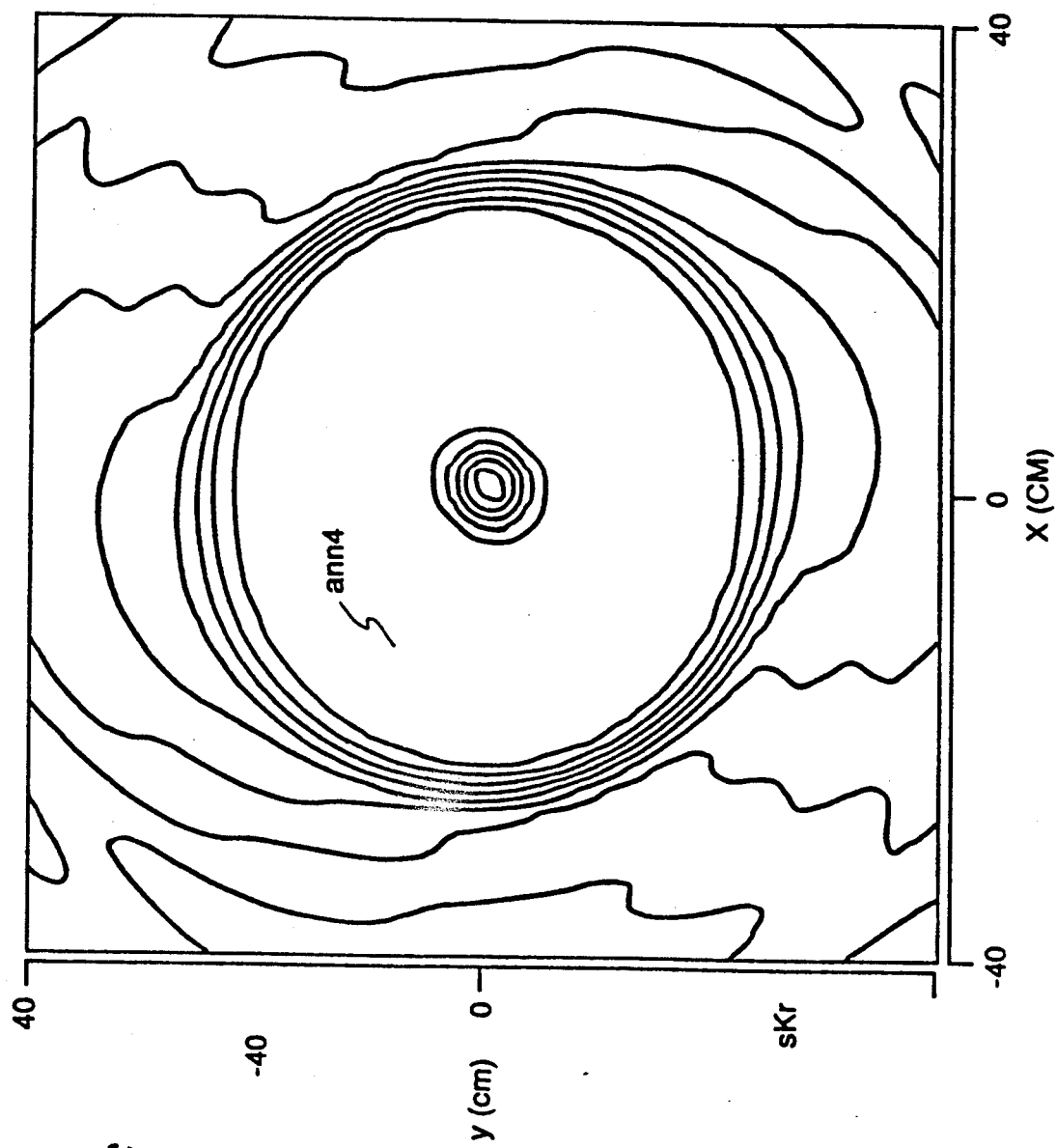
FIG. 4c is a contour plot of the 2D NMR excitation profile of the pulse of FIG. 4b.
Figure 4D:
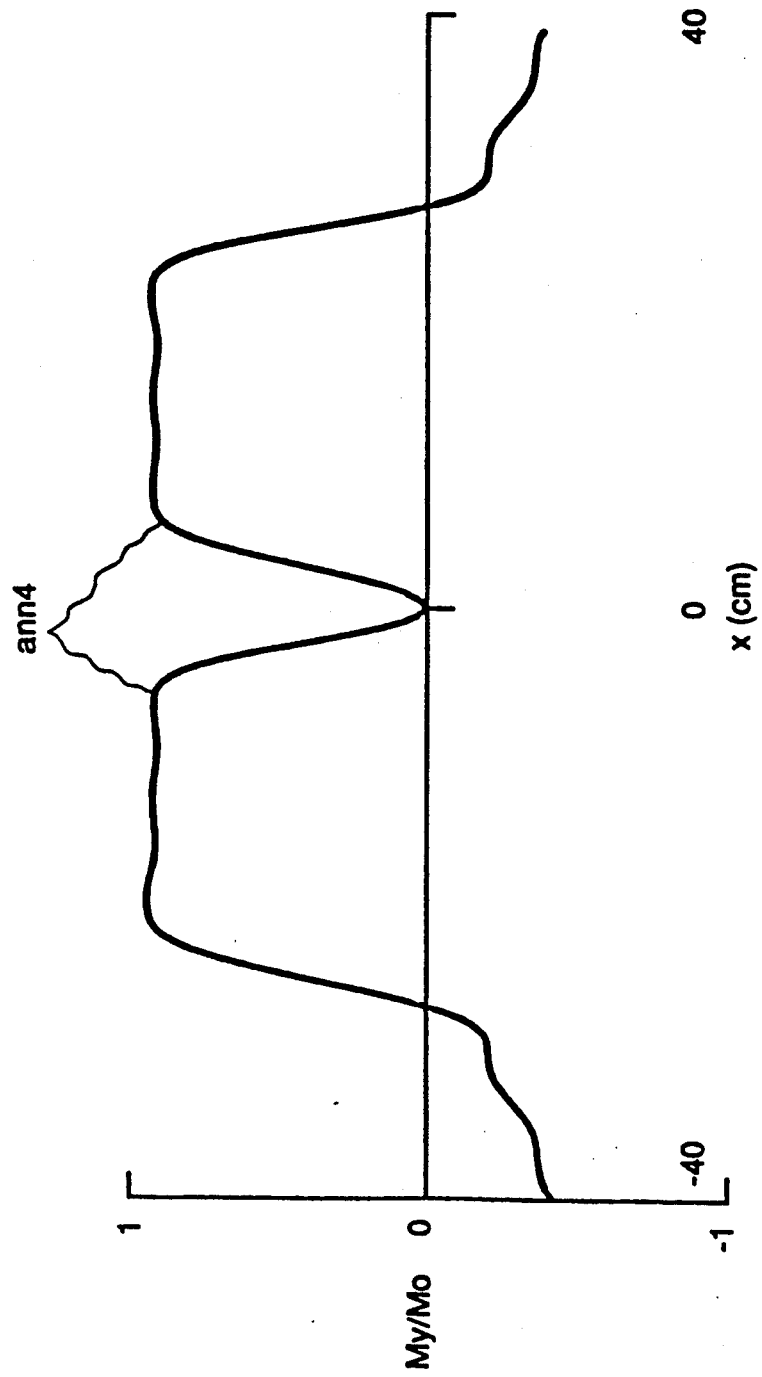
FIG. 4d is a cross section at y=0 of the 2D profile of FIG. 4c.

Because of the symmetry of the annular target function $P_{targ}(x,y)$, the in-phase RF component $b_{1I}(t)$ is zero for all t. FIG. 4b shows the RF pulse b14 (of amplitude b14a) derived from the above expression for $b_{1Q}(t)$. This waveform is produced concurrently with the x and y gradient waveforms gx4 and gy4. FIG. 4c shows a contour plot of the resulting annular 2D excitation profile ann4. A cross section through the 2D profile is illustrated in FIG. 4d. This annular region is next dephased by application of a gradient crusher pulse.

Figure 3C:
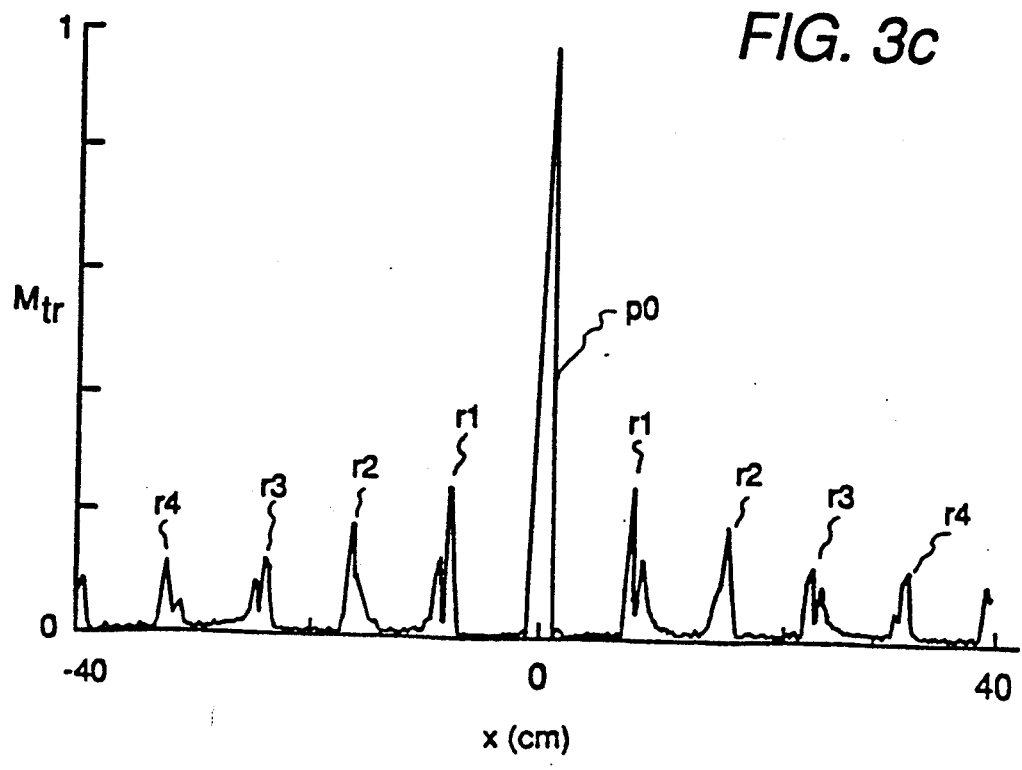
FIG. 3c is a cross section of the 2D profile of FIG. 3b at y=0.

The pencil excitation pulse of FIG. 3a is applied next. Comparison with the 8-cycle-spiral pencil-pulse cross section of FIG. 3c shows that the annular-saturation profile ann4 covers the inner two sampling rings r1 and r2 of the pencil pulse. Therefore 90° excitation and dephasing of this region will presaturate r1 and r2, leaving the third ring r3 (at a radius of 24 cm) as the innermost remaining artifact.

Figure 5A:
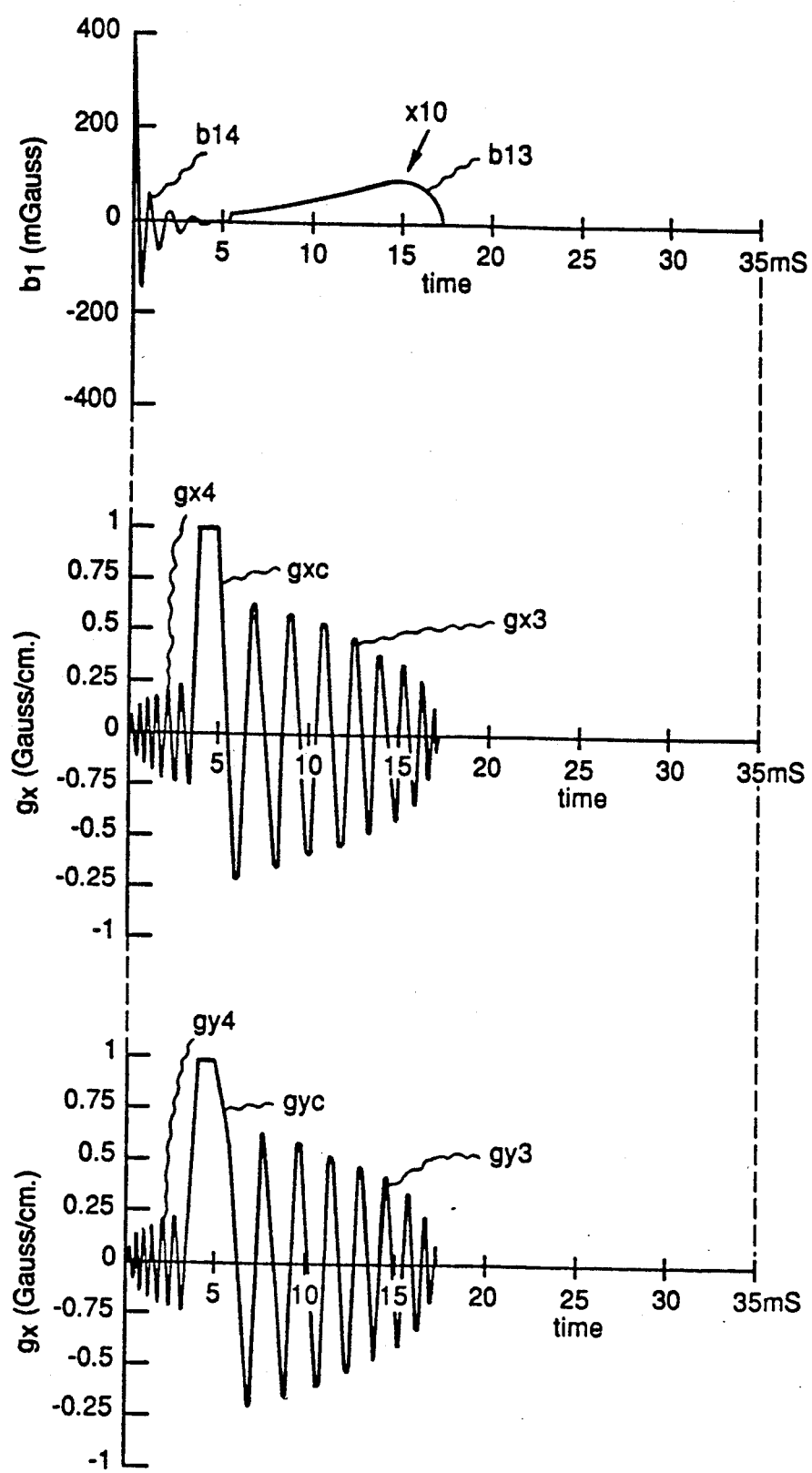
FIG. 5a is a pulse-sequence timing diagram of an annular presaturation pulse followed by an 8-cycle pencil-excitation pulse.

The full pulse sequence is shown in FIG. 5a, which diagrams the 3.5-ms-duration annular excitation pulse b14, gx4, and gy4, followed by 2-ms-duration gradient crusher lobes gxc and gyc which dephase the magnetization in the annulus, then followed by the 11.5-ms-long pencil pulse b13, gx3, and gy3.

Figure 5B:
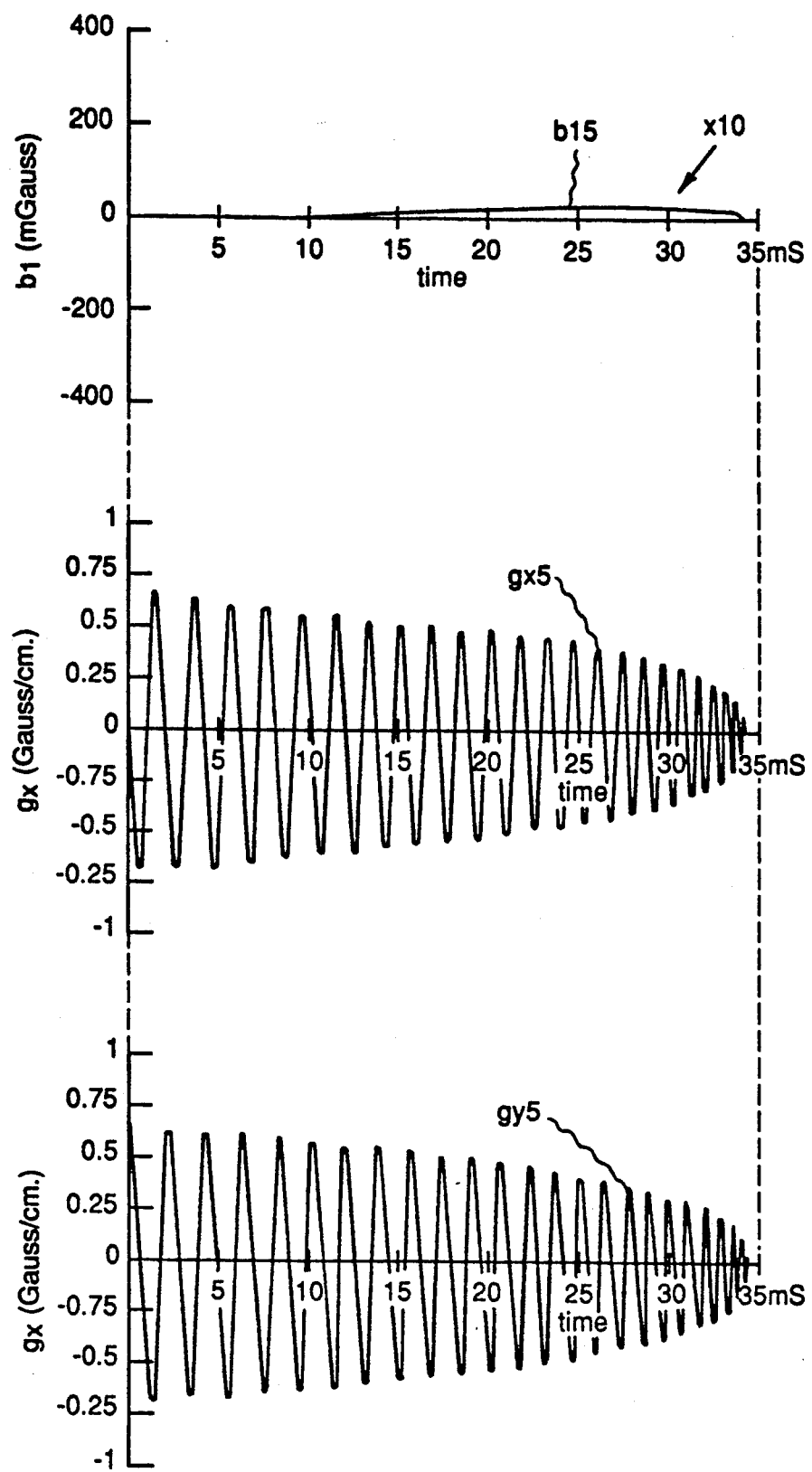
FIG. 5b is a pulse-sequence timing diagram of a 24-cycle pencil-excitation pulse.

For comparison, a 24-cycle pencil pulse b15, gx5, and gy5 is diagrammed in FIG. 5b. This also has an inner sampling ring at 24 cm, but requires a total pulse duration of 35 ms. Moreover, the bandwidth of the 8-cycle pencil pulse b13, gx3, and gy3 in conjunction with annular excitation pulse b14, gx4, and gy4 (FIG. 5a) is a factor of 3 better than the 24-cycle pencil pulse b15, gx5, and gy5 (FIG. 5b).

RF Power Reduction

The ring-saturation pulse b14, gx4, and gy4 of FIG. 4b has an RF pulse amplitude b14a that is more than a factor of two larger than a standard SIGNA® MR diagnostic system 180° pulse, which would result in unacceptably large RF power deposition. To overcome this, the peaks of the RF Pulse were flattened according to a two-dimensional application of variable-rate (VERSE) theory. Variable-rate remapping was first used in *Variable-rate Selective Excitation* by S. Conolly, et. al., J. Magn. Reson. 78, 440 (1988), to limit the peak RF power of one-dimensional slice-selective pulses. This two-dimensional application allows us to produce substantially the same broad-ring saturation ann4 shown in FIG. 4c, with lower RF peak power and with comparable pulse width. According to the VERSE principle, in any time increment during a selective excitation pulse, it is possible to reduce the amplitude of the RF pulse without distorting the excitation profile provided two conditions are met; the amplitude of any concurrent gradient(s) must be scaled down by the same factor as the RF amplitude, and the duration of that time increment of the pulse must be extended by the same factor by which the amplitudes were reduced. This forces an effective magnetic field vector of the combined magnetic field gradients to have the same orientation as it did before scaling, but with lower amplitude. The magnetic field gradients are applied for a longer period of time than before scaling to compensate for the reduced amplitude.

Variable rate remapping is applied to the pulse of FIG. 4b in the following manner. Waveforms b14, gx4, and gy4 are discrete waveforms of typically several hundred points. If we call the number of points $n_{pt}$, then the time increment for each point i is $dt_i = T_s/n_{pt}$, where $T_s$ is the total duration of the pulse. The waveforms are stepped along point by point, with a test performed at each point i to see whether the RF amplitude exceeds some preset limit $\pm b1_l$, in this embodiment, $\pm 147$ mG. If the RF amplitude does not exceed the limit, the values of each waveform $b1_i$, $gx_i$, and $gy_i$ as well as the time increment $dt_i$ are left unchanged. Thus, the remapped values (denoted by primes) are as follows:

$$b1_i' = b1_i \quad (7a)$$

$$gx_i' = gx_i \quad (7b)$$

$$gy_i' = gy_i \quad (7c)$$

$$dt_i' = dt_i \quad (7d)$$

If the limit $b1_l$ is exceeded, then a ratio $rb1_i = b1_i/b1_l$ is calculated. The RF and gradient waveforms are all scaled down by this factor and the time increment is scaled up. Thus, the waveform values become:

$$b1_i' = b1_i/rb1_i \quad (8a)$$

$$gx_i' = gx_i/rb1_i \quad (8b)$$

$$gy_i' = gy_i/rb1_i \quad (8c)$$

$$dt_i' = dt_i * rb1_i \quad (8d)$$

This yields a new set of waveforms $rf_i'$, $gx_i'$, $gy_i'$ mapped on a nonuniform time scale $dt_i'$. The next step is to interpolate these points onto a new uniformly spaced time scale. This can be done using any reasonable interpolation scheme such as the cubic spline method laid out in W. H. Press, et al., *Numerical Recipes*, Cambridge University Press, Cambridge, 1986, pp. 86–9.

Figure 6:
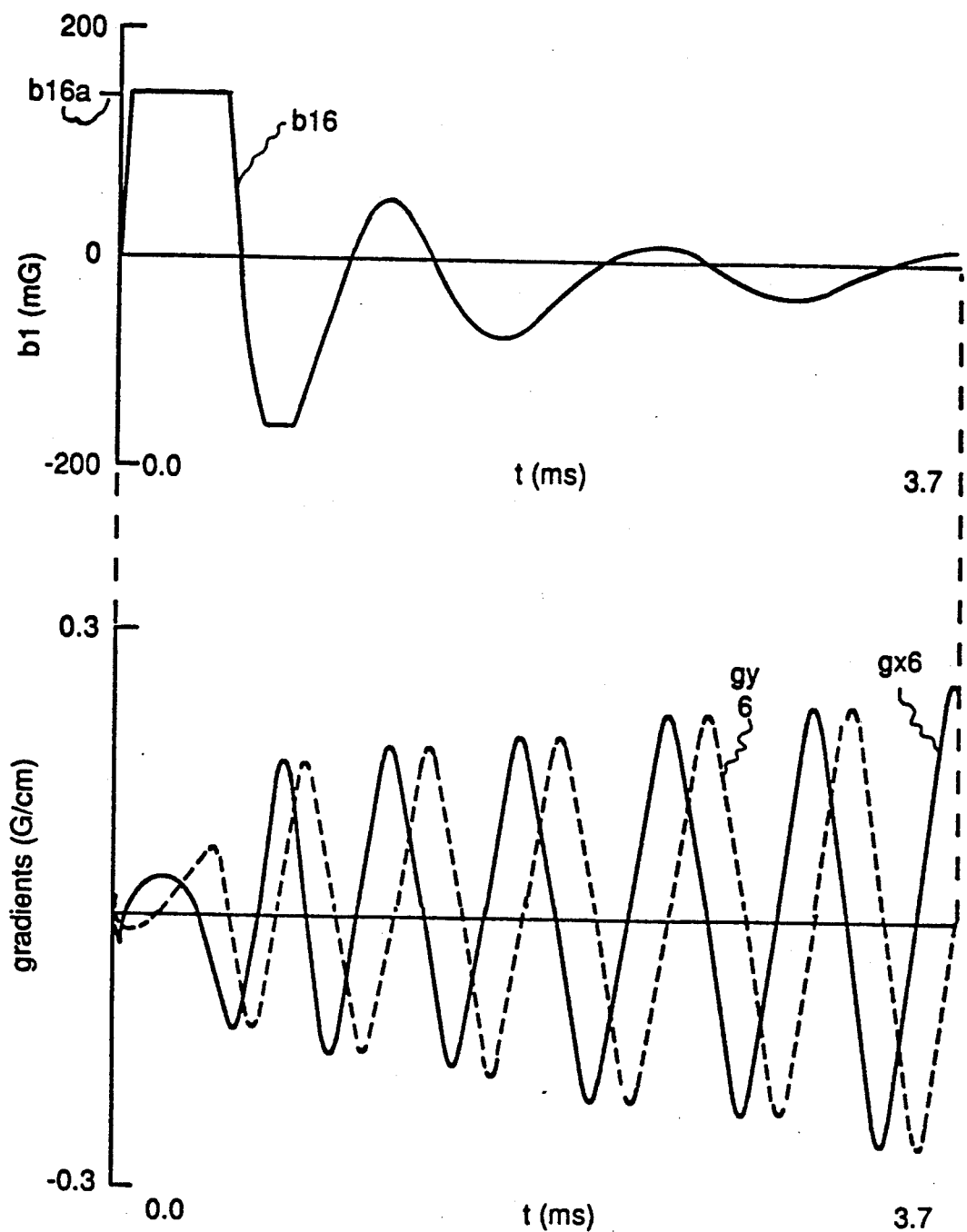
FIG. 6 is a pulse-sequence timing diagram of an annular excitation pulse which has been remapped to limit the peak RF power.

When this method is applied to pulse b14, gx4, and gy4 of FIG. 4b, with a limitation of ±147 mGauss (the amplitude of a SIGNA® 180° pulse) imposed on the RF waveform, the pulse of FIG. 6 results. Here, RF waveform b16a, of amplitude b16a=147 mGauss, and gx6 and gy6 are the x and y gradient waveforms, respectively. It can be seen that the RF amplitude has been reduced by a factor of b14a/b16a=2.8, (approx. 410 mGauss from FIG. 4b) and the RF peak power by a factor of roughly 8, with an increase in pulse duration of only 0.2 ms. The 2D excitation profile is the same as that (ann4) of FIG. 4c.

While several presently preferred embodiments of our novel invention have been described in detail herein, many modifications and variations will now become apparent to those skilled in the art. It is our intent therefore, to be limited only by the scope of the appending claims and not be the specific details and instrumentalities presented by way of explanation herein.

What we claim is:

1. A method of magnetic resonance (MR) imaging of a region of a subject while suppressing ring artifacts, comprising the steps of:
    a) defining a target annular region which covers ring artifacts, and excludes a central region;
    b) calculating a pair of time-varying magnetic field gradient waveforms $g_x(t)$, $g_y(t)$ along an "X" and "Y" axis respectively that, when applied with a predetermined radiofrequency (RF) pulse to the subject, will excite magnetization of the target annular region of the subject;
    c) calculating a time-varying RF pulse $b_1(t)$ that when applied to the subject with time-varying magnetic field gradient waveforms $g_x(t)$, $g_y(t)$ will excite magnetization of the target annular region of the subject;
    e) simultaneously applying the magnetic field gradient waveforms $g_x(t)$, $g_y(t)$ and the RF pulse $b_1(t)$ to the subject to excite magnetization of the target annular region of the subject;
    f) subsequently applying 'crusher' gradient pulses to dephase the excited magnetization in the annular region;
    g) applying a two-dimensional (2D) MR excitation pulse to said region to be imaged;
    h) receiving an MR response signal from the region to be imaged such that relatively little signal is contributed from the target annular region of said subject; and
    i) reconstructing an image of the region to be imaged having minimal sampling-ring artifacts from the MR response signal.

2. The method of MR imaging of a region of a subject as recited in claim 1 wherein the step of calculating a pair of time-varying magnetic field gradient waveforms $g_x(t)$, $g_y(t)$ comprises the steps of:
    a) selecting a continuous spiral trajectory spanning the annular region having vector components $k_x(t)$ and $k_y(t)$ in the "X" and "Y" axis direction, respectively;
    b) calculating the time-changing magnetic-field-gradient waveform $g_x(t)$ in the "X" axis direction from the continuous spiral trajectory according to the following equation:

$$g_x(t) = \frac{1}{\gamma}\left(\frac{dk_x(t)}{dt}\right)$$

where $\gamma$ is the gyromagnetic ratio of the subject being imaged; and
    c) calculating the time-changing magnetic field gradient waveform $g_y(t)$ in the "Y" axis direction according to the following equation:

$$g_x(t) = \frac{1}{\gamma}\left(\frac{dk_y(t)}{dt}\right).$$

3. The method of MR imaging of a region of a subject as recited in claim 1 wherein the step of calculating a time-varying RF pulse $b_1(t)$ comprises the steps of:
    a) calculating an in-phase component $b_{1I}(t)$ of the RF pulse $b_1(t)$ according to the equation:

$$b_{1I}(t) = W(t)\int_{-\infty}^{\infty}\int_{-\infty}^{\infty} P_{targ}(x,y)\sin(k_x(t)x + k_y(t)y)dxdy$$

where: $P_{targ}(x,y)$ represents the target annular region, and is set to 1 for those values of (x,y) falling inside the target annular region and 0 for those outside the annular region, and $$W(t) = \left(\frac{1}{\rho(k_x(t),k_y(t))}\right)\sqrt{g_x(t)^2 + g_y(t)^2} ,$$

where $$\frac{1}{\rho(k_x(t),k_y(t))} = \frac{k_m(t)/\kappa}{\sqrt{(k_m(t)/\kappa)^2 + 1/(2\pi n)^2}},$$

and $k_m(t) = \sqrt{k_x(t)^2 + k_y(t)^2}$, $\kappa$ is the outer radius of the continuous spiral trajectory; and
    b) calculating a quadrature-phase component $b_{1Q}(t)$ of the RF pulse $b_1(t)$ according to the equation:

$$b_{1Q}(t) = -W(t)\int_{-\infty}^{\infty}\int_{-\infty}^{\infty} P_{targ}(x,y)\cos(k_x(t)x + k_y(t)y)dxdy.$$

4. The method of MR imaging of a region of a subject as recited in claim 2 wherein the step of selecting a continuous spiral trajectory comprises a limited number of turns n, said continuous spiral trajectory spanning the annular region to a maximum outer radius $\kappa$ over time, said trajectory having vector components $k_x(t)$ and $k_y(t)$ in the "X" and "Y" axis directions respectively.

5. The method of MR imaging of a region of a subject as recited in claim 1 where the RF pulse $b_1(t)$ has an amplitude to produce an MR tip angle of approximately 90°.

6. The method of MR imaging of a region of a subject as recited in claim 1 where RF pulse $b_1(t)$ has an amplitude to produce an MR tip angle of slightly larger than 90°, so that when the subsequent gradient crusher pulses are applied, any longitudinal magnetization undergoing spin-lattice-relaxation recovery will recover from a slightly negative value to a value of zero at the start of the subsequent 2D MR excitation pulse.

7. The method of MR imaging of a region of a subject as recited in claim 1 where the RF pulse $b_1(t)$ and the pair of time-varying magnetic field gradient waveforms $g_x(t)$, $g_y(t)$ are reshaped to limit a maximum RF amplitude value to a predetermined level, and to extend the time of application of each to create the same excitation profile as. that of the RF pulse $b_1(t)$ and the pair of time-varying magnetic field gradient waveforms $g_x(t)$, $g_y(t)$ before reshaping.

8. The method of MR imaging of a region of a subject as recited in claim 7 where the annular excitation pulse is reshaped by the steps of:
   a) separating the RF pulse $b_1(t)$ and the pair of time-varying magnetic field gradient waveforms $g_x(t)$, $g_y(t)$ into discrete points $b1_i$, $gx_i$, $gy_i$ and $dt_i$ representing a point i of the RF pulse $b_1(t)$, the time-varying magnetic field gradient waveform $g_x(t)$, the time-varying magnetic field gradient waveform $g_y(t)$, and the time increment, respectively;
   b) testing each of said points to determine if the RF amplitude $b1_i$ exceeds a predetermined limit $\pm b1_l$, and, for each of said points,
      i. if it does not exceed $b1_l$, the values of each of the waveforms $b1_i$, $gx_i$, and $gy_i$ as well as the time increment $dt_i$ are left unchanged, yielding, for a set of scaled values:

$$b1_i' = b1_i$$

$$gx_i' = gx_i$$

$$gy_i' = gy_i$$

$$dt_i' = dt_i$$

ii. if it exceeds the limit $b1_l$, then:
      A. calculating a ratio $rb1_i = b1_i/b1_l$,
      B. scaling the RF and gradient waveforms down by the ratio $rb1_i$ and scaling the time increment is scaled up by the same amount according to the following equations:

$$b1_i' = b1_i/rb1_i$$

$$gx_i' = gx_i/rb1_i$$

$$gy_i' = gy_i/rb1_i$$

$$dt_i' = dt_i \cdot rb1_i$$

yielding a scaled values mapped onto a non-uniform time scale $dt_i'$; and
   c) interpolating the scaled values onto a uniformly spaced time scale to create waveforms to be applied in MR imaging which do not exceed the predetermined limit $\pm b1_l$.

* * * * *